(12) United States Patent
Kasperchik et al.

(10) Patent No.: US 7,700,258 B2
(45) Date of Patent: *Apr. 20, 2010

(54) COLOR FORMING COMPOSITIONS WITH IMPROVED MARKING SENSITIVITY AND IMAGE CONTRAST AND ASSOCIATED METHODS

(75) Inventors: Vladek P. Kasperchik, Corvallis, OR (US); Makarand P. Gore, Corvallis, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 73 days.

This patent is subject to a terminal disclaimer.

(21) Appl. No.: 11/029,324

(22) Filed: Jan. 4, 2005

(65) Prior Publication Data

US 2006/0147833 A1 Jul. 6, 2006
US 2007/0281244 A9 Dec. 6, 2007

Related U.S. Application Data

(63) Continuation-in-part of application No. 10/351,188, filed on Jan. 24, 2003, now Pat. No. 6,974,661.

(51) Int. Cl.
*G03C 1/00* (2006.01)
*B41M 5/20* (2006.01)
*C09D 11/00* (2006.01)

(52) U.S. Cl. .................... 430/270.1; 503/216; 503/226
(58) Field of Classification Search .............. 430/270.1; 503/216, 226; 106/31.2, 31.22
See application file for complete search history.

(56) References Cited

U.S. PATENT DOCUMENTS

| | | | |
|---|---|---|---|
| 1,674,128 A | 6/1928 | Rose | |
| 2,579,543 A | 12/1951 | Brode et al. | |
| 3,658,543 A | 4/1972 | Gerlach, Jr. et al. | |
| 4,126,466 A | 11/1978 | Roos | |
| 4,427,758 A | 1/1984 | Quinn | |
| 4,620,205 A * | 10/1986 | Iiyama et al. ............... 503/204 | |
| 4,925,828 A * | 5/1990 | Iiyama et al. ............... 503/218 |
| 5,024,699 A * | 6/1991 | Iiyama et al. ............... 106/31.2 |
| 5,071,480 A * | 12/1991 | Zink ....................... 106/31.22 |
| 5,187,049 A | 2/1993 | Sher et al. | |
| 5,230,985 A | 7/1993 | Lohaus et al. | |
| 5,274,623 A | 12/1993 | Usami et al. | |
| 5,286,704 A | 2/1994 | Yoshikawa et al. | |
| 5,362,536 A | 11/1994 | Fleming et al. | |
| 5,413,893 A * | 5/1995 | Tsukada et al. ............. 430/152 |
| 5,421,870 A * | 6/1995 | Scartazzini et al. ......... 523/161 |
| 5,426,088 A | 6/1995 | Janssens et al. | |
| 5,451,478 A | 9/1995 | Boggs et al. | |
| 5,543,381 A | 8/1996 | Kishimoto et al. | |
| 5,607,739 A | 3/1997 | Bartholomeusz | |
| 5,645,964 A | 7/1997 | Nohr et al. | |
| 5,824,715 A | 10/1998 | Hayashihara et al. | |
| 5,858,586 A | 1/1999 | Nohr et al. | |
| 5,952,073 A | 9/1999 | Hurditch et al. | |
| 5,955,224 A | 9/1999 | Caspar et al. | |
| 6,004,719 A | 12/1999 | Gaudiana et al. | |
| 6,077,584 A | 6/2000 | Hurditch | |
| 6,143,480 A | 11/2000 | Obayashi et al. | |
| 6,251,571 B1 | 6/2001 | Dessauer et al. | |
| 6,362,130 B1 * | 3/2002 | Hotta et al. ................. 503/201 |
| 6,528,230 B1 | 3/2003 | Takashima et al. | |
| 6,555,691 B2 | 4/2003 | Uchida et al. | |
| 6,586,364 B2 * | 7/2003 | Kubota et al. .............. 503/215 |
| 6,588,340 B2 * | 7/2003 | Friedman .................... 101/467 |
| 6,593,069 B2 | 7/2003 | Oya et al. | |
| 6,605,418 B1 | 8/2003 | Ramsden et al. | |
| 6,680,281 B2 * | 1/2004 | Tajiri et al. ................. 503/209 |
| 6,713,523 B2 | 3/2004 | Nagata et al. | |
| 6,974,661 B2 * | 12/2005 | Gore et al. .................. 430/343 |
| 7,060,654 B2 * | 6/2006 | Kasperchik et al. ......... 503/208 |
| 7,172,991 B2 * | 2/2007 | Anderson et al. ........... 503/206 |
| 2003/0060366 A1 * | 3/2003 | Kaneko et al. .............. 503/209 |
| 2004/0146812 A1 * | 7/2004 | Gore et al. .................. 430/343 |
| 2004/0147399 A1 | 7/2004 | Gore | |
| 2007/0099798 A1 | 5/2007 | Nagai et al. | |

FOREIGN PATENT DOCUMENTS

| | | | |
|---|---|---|---|
| EP | 0 384 665 A | | 8/1990 |
| EP | 716135 A1 | * | 6/1996 |
| EP | 0 889 363 A1 | | 1/1999 |
| EP | 889363 A1 | * | 1/1999 |
| EP | 716135 B1 | * | 9/1999 |
| EP | 0 994 381 A1 | | 4/2000 |
| EP | 1 273 457 A | | 1/2003 |
| EP | 1 398 169 A | | 3/2004 |
| WO | WO 2006/001814 A | | 1/2006 |
| WO | 2006073801 A2 | | 7/2006 |

OTHER PUBLICATIONS

Edward Ehlinger: "Direct Thermal Dyes", SPIE Proceedings, 1990, pp. 308-315.

(Continued)

*Primary Examiner*—Cynthia H Kelly
*Assistant Examiner*—Connie P Johnson

(57) ABSTRACT

Compositions and methods for production of color images which are developable with improved marking sensitivity and image contrast are disclosed and described. Specifically, a color forming composition can comprise a polymeric activator phase including a polymer matrix and an activator dissolved therein, a color former phase including a color former, and a radiation absorber in thermal contact with the color former phase. Particularly, the color former phase can be finely dispersed within the polymeric activator phase at an average particle size of less than 2 μm.

54 Claims, No Drawings

OTHER PUBLICATIONS

State Intellectual Property Office, P.R. China; First Office Action; Patent Application in China entitled "Color Forming Composition With Improved Marking Sensitivity And Image Contrast And Associated Methods"; dated Jun. 19, 2009; China.

European Patent Office. Communication pursuant to Article 94(3) EPC, 4 month Office Action, Sep. 11, 2009, 3 pages.

* cited by examiner

COLOR FORMING COMPOSITIONS WITH IMPROVED MARKING SENSITIVITY AND IMAGE CONTRAST AND ASSOCIATED METHODS

This application is a continuation-in-part of U.S. patent application Ser. No. 10/351,188, filed on Jan. 24, 2003.

FIELD OF THE INVENTION

The present invention relates generally to color forming compositions. More particularly, the present invention relates to methods and compositions which can form images upon interaction with energy, such as light energy, with improved marking sensitivity and image contrast.

BACKGROUND OF THE INVENTION

Compositions which produce a color change upon exposure to energy in the form of light or heat are of great interest in producing images on a variety of substrates. Optical disks represent a significant percentage of the market for data storage of software as well as of photographic, video, and/or audio data. Typically, optical disks have data patterns embedded thereon that can be read from and/or written to one side of the disk, and a graphic display or label printed on the other side of the disk.

In order to identify the contents of the optical disk, printed patterns or graphic display information can be provided on the non-data, or label, side of the disk. The patterns or graphic display can be both decorative and provide pertinent information about the data content of the disk. In the past, commercial labeling has been routinely accomplished using screen-printing methods. While this method can provide a wide variety of label content, it tends to be cost ineffective for production of less than about 400 customized disks because of the fixed costs associated with preparing a stencil or combination of stencils and printing the desired pattern or graphic display.

In recent years, the significant increase in the use of optical disks for data storage by consumers has increased the demand to provide customized labels to reflect the content of the optical disk. Most consumer available methods of labeling are limited to either handwritten descriptions which lack professional appearance, quality and variety, or preprinted labels which may be affixed to the disk, but which can also adversely affect the disk performance upon spinning at high speeds.

Recently, color forming compositions have been developed which can be developed using energy sources such as lasers in order to form an image. However, many of these color forming compositions have development sensitivities that result in slower development time and/or less than acceptable contrast. Thus, the need still exists for improvement in color forming compositions with improved marking sensitivity and image contrast.

SUMMARY OF THE INVENTION

It has been recognized that it would be advantageous to provide rapidly developable color forming compositions with improved marking sensitivity, which can also be used to provide images with improved image contrast, even under fast development conditions. In one aspect of the present invention, a color forming composition can include a polymeric activator phase including a polymer matrix and an activator dissolved therein, a color former phase including a color former, and a radiation absorber in thermal contact with the color former phase. Particularly, the color former phase can be finely dispersed within the polymeric activator phase at an average particle size of less than 2 µm.

In another embodiment, a method of forming an image can comprise applying electromagnetic radiation to a color forming composition sufficient to develop the color forming composition from a pre-development state to a post-development state that is visually different than the pre-development state. The color forming composition can comprise a polymeric activator phase including a polymer matrix and an activator dissolved therein, a color former phase including a color former, and a radiation absorber in thermal contact with the color former phase. Again, the color former phase can be finely dispersed within the polymeric activator phase at an average particle size of less than 2 µm.

Additional aspects and advantages of the invention will be apparent from the detailed description which follows.

DETAILED DESCRIPTION OF THE PREFERRED EMBODIMENT(S)

Reference will now be made to exemplary embodiments and specific language will be used herein to describe the same. It will nevertheless be understood that no limitation of the scope of the invention is thereby intended. Alterations and further modifications of the inventive features described herein and additional applications of the principles of the invention as described herein, which would occur to one skilled in the relevant art and having possession of this disclosure, are to be considered within the scope of the invention. Further, before particular embodiments of the present invention are disclosed and described, it is to be understood that this invention is not limited to the particular process and materials disclosed herein as such may vary to some degree. It is also to be understood that the terminology used herein is used for the purpose of describing particular embodiments only and is not intended to be limiting, as the scope of the present invention will be defined only by the appended claims and equivalents thereof.

In describing and claiming the present invention, the following terminology will be used.

The singular forms "a," "an," and "the" include plural referents unless the context clearly dictates otherwise. Thus, for example, reference to "a radiation absorber" includes reference to one or more of such materials.

As used herein, the term "color forming composition" typically includes a color former, an activator, a radiation absorber, and a polymer matrix. These components can work together upon exposure to radiation to develop the color former, thereby creating a color from a colorless material, or alternatively, causing a color to change from a first color to another color. In other words, an undeveloped color former can be colorless or may have some color which changes upon development to a different color. Though the term "color forming composition" describes the presence of four compositional components, these compositions do not have to be present in a single phase or layer. For example, though it preferred to have the radiation absorber admixed with one or both of the phases in the color forming composition due to development speed concerns, the radiation absorber can be in a separate layer.

As used herein, the term "color former" refers to any composition which changes color upon application of energy. Color formers are typically leuco dyes, photochromic dyes, or the like. In accordance with embodiments of the present invention, the color former will be present as part of a discontinuous phase that is finely dispersed within a continuous polymeric phase. The term "color former" does not infer that color is generated from scratch, as it includes materials that can change in color, as well as materials that can become colored from a colorless or more transparent state.

The term "activator" refers to compounds or materials that, upon the presence of energy (such as heat generated by a laser and a radiation absorber), can react or otherwise interact with a color former to modify or create color within a color forming composition. Activators can be any material that reacts or interacts with color formers to cause color creation or change of the color former. In some embodiments, multiple activators can be used, e.g., multiple activator systems having from coequal performance value to systems having a primary activator and secondary activator(s). In one embodiment, for example, the activator can be an acidic compound or material that donates a proton necessary to develop a certain class of leuco dye.

As used herein, "radiation absorber" refers generally to a radiation sensitive agent that can generate heat or otherwise transfer energy to surrounding molecules upon exposure to radiation at a specific wavelength. When admixed with and/or in thermal contact with a leuco dye and/or a corresponding activator, a radiation absorber can be present in sufficient quantity so as to produce energy sufficient to at least partially develop the color former.

As used herein, "developing," "development," or the like refers to an interaction or reaction which affects the color former to produce a visible change in its appearance, e.g., from colorless or transparent to colored or from a first color to a second color. In one embodiment, the color former can be a leuco dye that is reduced by an acidic activator to generate a color or change in color.

For purposes of the present invention, the term "color" or "colored" refers to absorbance and reflectance properties that are preferably visible, including properties that result in black, white, or traditional color appearance. In other words, the terms "color" or "colored" includes black, white, and traditional colors, as well as other visual properties, e.g., pearlescent, reflective, translucent, transparent, etc.

As used herein, "thermal contact" refers to the spatial relationship between a radiation absorber and other members of the color forming composition (including the color former and/or the activator). For example, when a radiation absorber is heated by interaction with laser radiation, the energy generated by the absorber should be sufficient to cause the color former of color forming composition to darken, lighten, become colored, or otherwise change in visible perception, such as through a chemical reaction. Thermal contact can include close proximity between a radiation absorber and other members of the color forming composition, which allows for energy transfer from the absorber toward the color former and/or activator. Thermal contact can also include actual contact between a radiation absorber and one or more other members of the color forming composition, such as in immediately adjacent layers, or in an admixture including some or all of the other constituents. In accordance with embodiments of the present invention, the radiation absorber can be present within a color former phase, within a polymeric activator phase, and/or layered with respect to the color former/polymeric activator dispersion. If fast development times are desired, in one embodiment, mixing radiation absorbers with the polymeric activator phase and the color former phase can reduce melt times, resulting in rapid mixing of the phases.

As used herein, the term "coating composition," or other similar referents typically refers to carrier having various components dissolved or dispersed therein. The carrier can be a liquid or paste-like carrier, or can be one of the components of the color forming composition per se, e.g., polymer matrix, etc. In one embodiment, the composition can comprise a color former phase finely dispersed in a polymeric activator phase. Other components can be present in one or both of these phases. Color forming compositions can be spin-coatable in one embodiment, or can be configured for other application methods as well, e.g., printing such as by offset, ink-jet, gravure, roller coating, screen printing, spraying, or other application methods known to those skilled in the art. Once the coating composition is applied to a substrate, it can be referred to as simply a "coating."

As used herein, "optical disk" is meant to encompass audio, video, multi-media, and/or software disks that are machine readable in a CD and/or DVD drive, or the like. Examples of optical disk formats include writeable, recordable, and rewriteable disks such as DVD, DVD-R, DVD-RW, DVD+R, DVD+RW, DVD-RAM, CD, CD-ROM, CD-R, CD-RW, and the like. Other like formats may also be included, such as similar formats and formats to be developed in the future.

As used herein, "graphic display" can include any visible character or image found on an optical disk. Typically, the graphic display is found prominently on one side of the optical disk, though this is not always the case.

As used herein, "data" is typically used with respect to the present disclosure to include the non-graphic information contained on the optical disk that is digitally or otherwise embedded therein. Data can include audio information, video information, photographic information, software information, and the like. Alternatively, the term "data" is sometimes used to describe the information a computer or other processor uses to draw from in order to mark an image on a color-forming composition in accordance with embodiments of the present invention.

Concentrations, amounts, and other numerical information may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a size range of about 1 µm to about 200 µm should be interpreted to include not only the explicitly recited limits of 1 µm to about 200 µm, but also to include individual sizes such as 2 µm, 3 µm, 4 µm, and sub-ranges such as 10 µm to 50 µm, 20 µm to 100 µm, etc.

In accordance with the present invention, a color forming composition can include a polymeric activator phase including a polymer matrix and an activator dissolved therein, a color former phase including a color former, and a radiation absorber in thermal contact with the color former phase. Particularly, the color former phase can be finely dispersed within the polymeric activator phase at an average particle size of less than 2 µm. The color forming composition as a whole can have a pre-development state and a post-development state. The pre-development state typically has a first visual appearance that is visually different than the post-development state. For example, the color forming composition can either be colorless or have a first color when in the pre-development state, and is of a second color after development when in the post-development state.

In another embodiment, a method of forming an image can comprise applying electromagnetic radiation to a color forming composition sufficient to develop the color forming composition from a pre-development state to a post-development state that is visually different than the pre-development state. The color forming composition can comprise a polymeric activator phase including a polymer matrix and an activator dissolved therein, a color former phase including a color former, and a radiation absorber in thermal contact with the color former phase. Again, the color former phase can be finely dispersed within the polymeric activator phase at an average particle size of less than 2 μm.

Upon application of suitable electromagnetic radiation, such as in the form of a laser, the radiation absorber and color former are heated sufficiently to develop the color former. In particular, the compositions and methods of the present invention provide the ability to reduce the energy requirements for developing color forming compositions in accordance with embodiments of the present invention. For example, a lower amount of energy is required to melt, diffuse, or heat to a desired reaction temperature when small particles are used, and thus, faster write times and contrast can be achieved. Specific polymer matrices, color formers, radiation absorbers, activators, and other optional components of the color forming composition can each affect the development properties and long-term stability of the color forming composition and are discussed in more detail below.

Polymeric Activator Phase

The color forming compositions of the present invention include a polymer activator phase, which comprises at least a polymer matrix and an activator. In one embodiment, the polymeric activator phase can include a radiation-curable polymer with an acidic (proton-donating) activator dispersed or preferably dissolved therein. As mentioned above, a color former phase is finely dispersed within the polymeric activator phase. Various polymer matrix materials can influence the development properties of the color forming composition such as development speed, light stability, and wavelengths which can be used to develop the color forming composition.

Acceptable polymer matrix materials can include, by way of example, UV curable polymers such as acrylate derivatives, oligomers, and monomers. These materials are often included or assembled as part of a photo package. A photo package can include a light absorbing species which initiates reactions for curing of a lacquer. Such light absorbing species can be sensitized for curing using UV or electron beam curing systems, and include, by way of example, benzophenone derivatives. Other examples of photoinitiators for free radical polymerization monomers and pre-polymers can include, but are not limited to, thioxanethone derivatives, anthraquinone derivatives, acetophenones, and benzoine ethers.

In particular embodiments of the invention, it can be desirable to choose a polymer matrix which is cured by a form of radiation that does not also develop the color former or otherwise decrease the stability of the color forming composition at the energy input and flux necessary to cure the coatings. Thus, the polymer matrix can be curable at a curing wavelength which is other than the developing wavelength of the color forming composition. For example, in one embodiment, the curing wavelength can be in the ultraviolet (UV) range and the developing wavelength can be in the infrared range. Alternatively, the curing wavelength and the developing wavelength can both be in the UV range, but may be different enough such that the curing wavelength does not substantially cause undesired development of the color forming composition. For example, selecting a first UV wavelength of 405 nm for the developing wavelength and a second UV wavelength of about 200 nm to about 380 nm for the curing wavelength of the polymer matrix may provide an effective system for curing the polymer without prematurely developing the color forming composition.

Radiation curable polymers can include certain photoinitiators for initiating curing upon exposure to radiation. Suitable photoinitiator should also have light absorption band which is not obscured by the absorption band of the radiation absorber (as will be discussed hereinafter), otherwise the radiation absorber can interfere with photoinitiator activation, and thus, prevent proper curing of the coating. Therefore, in one practical embodiment, a photoinitiator light absorption band can lie within the UV region, e.g., from about 200 nm to about 380 nm, and the absorber band can lie outside of this range, e.g., about 390 to about 1100 nm. In practice, the lower end of the radiation absorber band probably would overlap with the UV wavelength range used for polymer curing. However, a working system design is possible because the energy flux required for development of a color former is about ten times higher than needed for initiation of polymer curing. In yet another embodiment, the absorber has a dual function; one of sensitization of UV cure under cure conditions (relatively low energy flux), and another of providing energy for marking during the marking function. This is possible because the energy flux during cure is typically an order of magnitude lower than needed for producing a mark.

Polymer matrix materials based on cationic polymerization resins can include photo-initiators including aromatic diazonium salts, aromatic halonium salts, aromatic sulfonium salts, and metallocene compounds. Additional examples of curing agents are α-aminoketones, α-hydroxyketones, phosphineoxides available from Ciba-Geigy under the name of Irgacure and Darocure agents, and sensitizers such as 2-isopropyl-thioxanthone. One specific example of a suitable polymer matrix is Nor-Cote CDG-1000 (a mixture of UV curable acrylate monomers and oligomers) which contains a photoinitiator (hydroxy ketone) and organic solvent acrylates, e.g., methyl methacrylate, hexyl methacrylate, beta-phenoxy ethyl acrylate, and hexamethylene acrylate, available from Nor-Cote. Other suitable components for polymer matrix materials can include, but are not limited to, acrylated polyester oligomers, such as CN293 and CN294 as well as CN-292 (low viscosity polyester acrylate oligomer), SR-351 (trimethylolpropane triacrylate), SR-395(isodecyl acrylate) and SR-256(2(2-ethoxyethoxy)ethyl acrylate), all of which are available from Sartomer Co.

Additionally, binders can be included as part of the polymer matrix. Suitable binders can include, but are not limited to, polymeric materials such as polyacrylate from monomers and oligomers, polyvinyl alcohols, polyvinyl pyrrolidines, polyethylenes, polyphenols or polyphenolic esters, polyurethanes, acrylic polymers, and mixtures thereof. For example, the following binders can be used in the color forming composition of the present invention: cellulose acetate butyrate, ethyl acetate butyrate, polymethyl methacrylate, polyvinyl butyral, and mixtures thereof.

In short, the polymer matrix of the polymeric activator phase can be a single polymer or a group of polymers. The polymers can act as a solute of the polymeric activator phase, or can be dissolved or dispersed in another material, such as a solvent or another component of the phase. If multiple polymers are present, the polymers can be blended, crosslinked, or otherwise combined. In one embodiment, the polymer matrix can include a radiation curable polymer or system of polymers, oligomers, and/or monomers, etc. Though the polymer matrix is integral to the polymeric activator phase, it can be present in any of a number of forms.

The polymeric activator phase also includes an activator, which depending on the color former used in the color former phase, can be a reducing agent. Typical activators that can be used include any of a variety of acids. For example, the activator can be an acidic phenolic compound. Further, these activators can be readily dissolvable in the polymer matrix under the conditions which the dispersion is to be prepared and/or stored.

Non-limiting examples of suitable activators include bis-phenol A, bis-phenol S, p-hydroxy benzyl benzoate, TG-SA (Phenol, 4,4-α-sulfonylbis[2-(2-propenyl)), and poly-phenols. Examples of additional acidic materials that can be used as activators include any Lewis acid, without limitation, phenols, carboxylic acids, cyclic sulfonamides, protonic acids, zinc chloride, magnesium carboxylates, zinc carboxylates, calcium carboxylates, transition metal salts and other compounds having a pKa of less than about 7.0, and mixtures thereof. Specific phenolic and carboxylic secondary activators can include, without limitation, boric acid, oxalic acid, maleic acid, tartaric acid, citric acid, succinic acid, benzoic acid, stearic acid, gallic acid, salicylic acid, 1-hydroxy-2-naphthoic acid, o-hydroxybenzoic acid, m-hydroxybenzoic acid, 2-hydroxy-p-toluic acid, 3,5-xylenol, thymol, p-t-butylphenyl, 4-hydroxyphenoxide, methyl-4-hydroxybenzoate, 4-hydroxyacetophenone, α-naphthol, naphthols, catechol, resorcin, hydroquinone, 4-t-octylcatechol, 4,4'-butylidenephenol, 2,2'-dihydroxydiphenyl, 2,2'-methylenebis(4-methyl-6-t-butyl-phenol), 2,2'-bis(4'-hydroxyphenyl)propane, 4,4'-isopropylidenebis(2-t-butylphenol), 4,4'-secbutylidenediphenol, pyrogallol, phloroglucine, phlorogluocinocarboxylic acid, 4-phenylphenol, 2,2'-methylenebis(4-chlorophenyl), 4,4'-isopropylidenediphenol, 4,4'-isopropylidenebis(2-chlorophenol), 4,4'-isopropylidenebis (2-methylphenol), 4,4'-ethylenebis(2-methylphenol), 4,4'-thiobis(6-t-butyl-3-methylphenol), bisphenol A and its derivatives (such as 4,4'-isopropylidenediphenol, 4-4'-cyclohexylidenediphenol, p,p'-(1-methyl-n-hexylidene)diphenol, 1,7-di(4-hydroxyphenylthio)-3,5-dioxaheptane), 4-hydroxybenzoic esters, 4-hydroxyphthalic diesters, phthalic monoesters, bis(hydroxyphenyl)sulfides, 4-hydroxyarylsulfones, 4-hydroxyphenylarylsulfonates, 1,3-di[2-(hydroxyphenyl)-2-propyl]benzenes, 1,3-dihydroxy-6-(α,α-dimethylbenzyl)benzene, resorcinols, hydroxybenzoyloxybenzoic esters, bisphenolsulfones, bis-(3-allyl-4-hydroxyphenyl)sulfone (TG-SA), bisphenolsulfonic acids, 2,4-dihydroxy-benzophenones, novolac type phenolic resins, polyphenols, saccharin, 4-hydroxy-acetophenone, p-phenylphenol, benzyl-p-hydroxybenzoate(benzalparaben), 2,2-bis(p-hydroxyphenyl)propane, p-tert-butylphenol, 2,4-dihydroxy-benzophenone, and p-benzylphenol.

Typically, the activator will be present in the color forming composition as a whole at from 2 wt % to about 80 wt %. Because the activator is present in the polymeric activator phase, it will typically remain predominantly in this phase until the polymeric activator phase becomes at least partially molten and the color former phase begins to melt with the polymeric activator phase. In other words, by including the activator in the polymeric activator phase, the activator is kept substantially separated from the color former phase until the composition is heated. Upon heating with laser energy coming in contact with a radiation absorber, the polymeric activator phase can become molten and the particles of the color former phase become melted therein. Upon melting, the activator contacts the color former, thereby causing a modification in color of the color former, e.g., leuco dye.

In addition to the polymer matrix and the activator, other optional ingredients can also be present in the polymeric activator phase. For example, in embodiments where fluoran-type leuco dyes (or other similar color formers) are used in the color former phase, the polymeric activator phase can also include a stabilizer capable of stabilizing the fluoran leuco dye after melting the two phases together, i.e. when the leuco dye is in its post-development colored state. Specifically, the post-development colored state of a fluoran leuco dye can have an open lactone ring. Image fade that can occur with many Leuco-dye-based thermochromic coatings can be related to leuco dye crystallization from after an amorphous melt. For the above reasons, an aromatic species capable of stabilizing the post-development leuco dye in the amorphous phase can provide image stabilization by retarding/preventing leuco dye crystallization. Exemplary aromatic stabilizers that can be used to stabilize post-development leuco dyes, i.e. after melt, include, but are not limited to zinc salts such as zinc stearate, zinc hexanoate, zinc salicylate, and zinc acetate; carboxylates such as calcium monobutylphthalate and sulfonyl urea derivatives; and phenolic compounds such as bisphenol-A, sulfonyl diphenol, TG-SA, and zinc or calcium salts thereof. As a general guideline, the color forming compositions of the present invention can include from about 1 wt % to about 40 wt % of this or another type of stabilizer. Preferably, the stabilizer can be present at from about 2 wt % to about 20 wt % of the total composition.

Color Former Phase

Color forming compositions of the present invention can include a color former phase dispersed within the polymeric activator phase discussed above. Typically, the color former phase is substantially insoluble in the polymer matrix, exists distinct from the polymer matrix at room temperature, and is finely dispersed within the polymer matrix. The dispersion can be formed using color former particles prepared by any known method such as mixing, rolling, milling, or the like, provided a sub-2 μm average particle size can be achieved in the dispersion. In most cases, it can be desirable to uniformly disperse the color former phase throughout the polymer matrix. Dispersing the color former phase within the polymer matrix allows for increased contact of the leuco dye with activator material and/or other energy transfer materials, which are discussed below in more detail. Further, a dispersion of color former phase within the polymer matrix can be formed as a single composition, e.g., a paste, which can then be coated on a substrate in a single step. The volume of color former phase dispersed within the polymer matrix can vary considerably depending on the concentration and type of color former used, as well as a number of other factors such as desired development speed, desired color intensity of developed color former, and the like. However, as a general guideline, the color former phase volume percent in the polymer matrix can be from about 1% to about 50%, and in some cases from about 10% to about 30%.

In accordance with embodiments of the present invention, it has been discovered that color forming phase particle size is related to multiple desirable properties. Specifically, including the color former phase as a fine dispersion, i.e. less than 2 μm, within the polymeric activator phase has several advantages over embodiments that utilize larger color former phase particles. These advantages seem to become enhanced even further as the particle size is reduced. In accordance with this recognition, in a preferred embodiment, the average particle size of the color former phase can be less than about 1.5 μm, such as from about 0.05 μm to about 1.5 μm, or from about 0.2 μm to about 1.5 μm. In another embodiment, the average particle size of the color former phase can be from about 0.05 μm to about 1 μm, and still in another embodiment, the average particle size of the color former phase is from about 0.05 μm to about 0.7 μm. In each of these embodiments, typically, the color former phase is distinct and substantially insoluble in the polymeric activator phase (typically at room temperature), and upon application of heat at from about 90° C. to about 350° C., the polymeric activator phase becomes at least partially molten and the color former phase at least partially melts therein. Similar effects are observed by delivery of energy using light and an absorber as a source of enegy. Further, more complete melting can improve or increase image contrast in some embodiments. Thus, in one embodiment, substantially complete to even complete melting of the color former phase in the polymeric activator phase can be preferred.

Without being bound by any particular theory, there are at least two likely reasons why these very small color former phase particle sizes provide improvement in marking sensitivity and/or image contrast. First, by decreasing the size of the particles of the color former phase, the surface area is increased, and thus, the surface area to volume ratio is also increased. A larger surface area to volume ratio facilitates faster melting of the color former phase particles as well as faster mixing of the molten color former particles with molten polymeric activator phase. As a result, faster imaging is possible. Further, more contrast can also be achieved by creating a more complete mix at the same or even faster write time typically used for these types of technologies. A second benefit is related to the particle size of the color former phase compared to the wavelength of the radiant energy used to heat the color forming composition as a whole. Typical lasers used for marking optical disks, for example, include those that range in wavelength from about 200 nm to about 1200 nm, i.e., 0.2 μm to about 1.2 μm. By providing particles that are roughly of the same order of magnitude or smaller compared to the wavelength of the laser that is used, light scattering is minimized or removed. In other words, light scattering caused by interaction of laser radiation with larger color former phase particles can result in partial reflection of the laser beam, causing unnecessary energy loss. By reducing the particle size to from slightly larger (about the same order of magnitude) to even below the wavelength of the imaging radiation, light scattering and/or energy depleting reflection is reduced or eliminated. Hence, improved absorption efficiency of the coating can be achieved, which translates into higher marking sensitivity of the color forming composition, higher contrast in some embodiments, and the ability to write images at higher speeds. Though not required, in one detailed embodiment, the laser energy wavelength is greater than or equal to the particle size of the color former phase prior to application of the laser energy. In another embodiment, the particle size of the color former phase prior to application of the laser energy is no more than two times larger than the wavelength of the laser energy (based on average particle size compared to wavelength).

The color former phase can include a variety of materials, but must include at least one color former. Exemplary color formers include leuco dyes, photochromic dyes, or the like. Fluoran leuco dyes have been shown to be particularly practical in accordance with embodiments of the present invention, though other leuco dyes can also be used. In one aspect of the present invention, the leuco dye can be a fluoran, phthalide, aminotriarylmethane, or mixture thereof. This being said, almost any known color forming dye can be used, as long as the color development criteria discussed herein are met. Suitable leuco dyes include, but are not limited to, fluorans, phthalides, aminotriarylmethanes, aminoxanthenes, aminothioxanthenes, amino-9,10-dihydro-acridines, aminophenoxazines, aminophenothiazines, aminodihydrophenazines, aminodiphenylmethanes, aminohydrocinnamic acids (cyanoethanes, leuco methines) and corresponding esters, 2(p-hydroxyphenyl)-4,5-diphenylimidazoles, indanones, leuco indamines, hydrozines, leuco indigoid dyes, amino-2,3-dihydroanthraquinones, tetrahalo-p,p'-biphenols, 2(p-hydroxyphenyl)-4,5-diphenylimidazoles, phenethylanilines, phthalocyanine precursors (such as those available from Sitaram Chemicals, India), and mixtures thereof.

As mentioned, fluoran based leuco dyes have proven exceptionally useful for incorporation into the color forming compositions of the present invention. Several non-limiting examples of suitable fluoran based leuco dyes include 3-diethylamino-6-methyl-7-anilinofluorane, 3-(N-ethyl-p-toluidino)-6-methyl-7-anilinofluorane, 3-(N-ethyl-N-isoamylamino)-6-methyl-7-anilinofluorane, 3-diethylamino-6-methyl-7-(o,p-dimethylanilino)fluorane, 3-pyrrolidino-6-methyl-7-anilinofluorane, 3-piperidino-6-methyl-7-anilinofluorane, 3-(N-cyclohexyl-N-methylamino)-6-methyl-7-anilinofluorane, 3-diethylamino-7-(m-trifluoromethylanilino)fluorane, 3-dibutylamino-6-methyl-7-anilinofluorane, 3-diethylamino-6-chloro-7-anilinofluorane, 3-dibutylamino-7-(o-chloroanilino)fluorane, 3-diethylamino-7-(o-chloroanilino)fluorane, 3-di-n-pentylamino-6-methyl-7-anilinofluoran, 3-di-n-butylamino-6-methyl-7-anilinofluoran, 3-(n-ethyl-n-isopentylamino)-6-methyl-7-anilinofluoran, 3-pyrrolidino-6-methyl-7-anilinofluoran, 1(3H)-isobenzofuranone,4,5,6,7-tetrachloro-3,3-bis[2-[4-(dimethylamino)phenyl]-2-(4-methoxyphenyl)ethenyl], 2-anilino-3-methyl-6-(N-ethyl-N-isoamylamino)fluorane (S-205 available from Nagase Co., Ltd), and mixtures thereof. Aminotriarylmethane leuco dyes can also be used in the present invention such as tris(N,N-dimethylaminophenyl)methane (LCV); deutero-tris(N,N-dimethylaminophenyl)methane (D-LCV); tris(N,N-diethylaminophenyl)methane(LECV); deutero-tris(4-diethylaminolphenyl)methane (D-LECV); tris(N,N-di-n-propylaminophenyl)methane (LPCV); tris(N,N-dinbutylaminophenyl)methane (LBCV); bis(4-diethylaminophenyl)-(4-diethylamino-2-methyl-phenyl) methane (LV-1); bis(4-diethylamino-2-methylphenyl)-(4-diethylamino-phenyl)methane (LV-2); tris(4-diethylamino-2-methylphenyl)methane (LV-3); bis(4-diethylamino-2-methylphenyl)(3,4-dimethoxyphenyl)methane (LB-8); aminotriarylmethane leuco dyes having different alkyl substituents bonded to the amino moieties wherein each alkyl group is independently selected from $C_1$-$C_4$ alkyl; and aminotriaryl methane leuco dyes with any of the preceding named structures that are further substituted with one or more alkyl groups on the aryl rings wherein the latter alkyl groups are independently selected from $C_1$-$C_3$ alkyl. Other color formers can also be used in connection with the present invention and are known to those skilled in the art. A more detailed discussion of some of these types of leuco dyes can be found in U.S. Pat. Nos. 3,658,543 and 6,251,571, each of which are hereby incorporated by reference in their entireties. Examples are found in *Chemistry and Applications of Leuco Dyes*, Muthyala, Ramaiha, ed.; Plenum Press, New York, London; ISBN: 0-306-45459-9, which is incorporated herein by reference.

Typically, the leuco dye can be present in color forming compositions of the present invention at from about 1 wt % to about 40 wt %. Although amounts outside this range can be successfully used, depending on the other components of the composition, amounts from about 5 wt % to about 20 wt % frequently provide adequate results.

In order to reduce development times and increase sensitivity to an applied radiation source, the color former phase can further include a melting aid. Suitable melting aids can have a melting temperature from about 50° C. to about 150° C. and often from about 70° C. to about 120° C. Melting aids are typically crystalline organic solids which can be melted and mixed with a particular color former. For example, most color formers are also available as a solid particulate which is soluble in standard liquid solvents. Thus, the color former and melting aid can be mixed and heated to form a molten mixture. Upon cooling, a color former phase of color former and melting aid is formed which can then be ground into a powder. In some embodiments of the present invention, the percent of color former and melting aid can be adjusted to minimize the melting temperature of the color former phase without interfering with the development properties of the leuco dye. When used, the melting aid can comprise from about 2 wt % to about 25 wt % of the color former phase.

A number of melting aids can be effectively used in the color forming compositions of the present invention. Several non-limiting examples of suitable melting aids include m-terphenyl, p-benzyl biphenyl, alpha-napthyl benzylether, 1,2-bis(3,4)dimethylphenyl ethane, and mixtures thereof. Suitable melting aids can also include aromatic hydrocarbons (or their derivatives) which provide good solvent characteristics with the leuco dye and radiation absorbers used in the formulations and methods of the present invention. In addition to dissolving the color former and radiation absorber, the melting aid can also assist in reducing the melting temperature of the color former and stabilize the color former phase in the amorphous state (or at least slow down recrystallization of the color former phase into individual components). In general, any material having a high solubility and/or miscibility with the color former to form a glass or co-crystalline phase with the dye, and alters the melting property of the dye is useful in this process. For example, aromatic hydrocarbons, phenolic ethers, aromatic acid-esters, long chain (C6 or greater) fatty acid esters, polyethylene wax, or the like can also be suitable melting aids.

Additional materials can also be included in the color former phase such as, but not limited to, stabilizers, antioxidants, non-leuco colorants, radiation absorbers, and the like.

Radiation Absorber

A radiation absorber can also be included in the color forming compositions of the present invention. The radiation absorber is typically present as a component which can be used to optimize development of the color forming composition upon exposure to radiation at a predetermined exposure time, energy level, wavelength, etc. The radiation absorber can act as an energy antenna, providing energy to surrounding areas upon interaction with an energy source. As a predetermined amount of energy can be provided by the radiation absorber, matching of the radiation wavelength and intensity to the particular absorber used can be carried out to optimize the system. Optimizing the system includes a process of selecting components of the color forming composition which can result in a rapidly developable composition under a fixed period of exposure to radiation at a specified power. For example, compositions of the present invention can be optimized for development using at a predetermined wavelength of laser energy, e.g., 405 nm, 650 nm, 780 nm, 980 nm, or 1084 nm, in which the color forming composition exposed to the radiation is developed in less than a predetermined period of time, e.g., less than 100 μsec. However, "optimized" does not necessarily indicate that the color forming composition is developed most rapidly at a specific wavelength, but rather that the composition can be developed within a specified time frame using a given radiation source. An optimized composition can also indicate an ambient light stability over extended periods of time, i.e. several months to years. Thus, an optimized composition results from a combination of all components of the color forming composition in affecting development characteristics and stability. To illustrate, in formulating the color forming composition of the present invention, an optimized composition can depend on a variety of factors, since each component can affect the development properties, e.g., time, color intensity, etc. For example, a color forming composition having a radiation antenna with a maximum absorption of about 780 nm may not develop most rapidly at 780 nm. Other components and the specific formulation can result in an optimized composition at a wavelength which does not correspond to the maximum absorption of the radiation antenna. Thus, the process of formulating an optimized color forming composition can include testing formulations to achieve a desired development time using a specific intensity and wavelength of energy to form an acceptable color change.

The radiation absorber can be configured to be in a heat-conductive relationship with the color formers of the present invention. For example, the radiation absorber can be included within the color former phase, the polymer matrix, and/or a separate layer. Thus, the radiation absorber can be admixed with or in thermal contact with the color forming composition. Typically, the radiation absorber can be present in both the color former phase and the polymeric activator phase. In this way, substantially the entire color forming composition in an exposed area can be heated quickly and substantially simultaneously. Alternatively, the radiation absorber can be applied as a separate layer which can be optionally spin-coatable or screen-printable, for example. Consideration can also be given to choosing the radiation absorber such that any light absorbed in the visible range does not adversely affect the graphic display or appearance of the color forming composition either before or after development.

Suitable radiation antenna can be selected from a number of radiation absorbers such as, but not limited to, aluminum quinoline complexes, porphyrins, porphins, indocyanine dyes, phenoxazine derivatives, phthalocyanine dyes, polymethyl indolium dyes, polymethine dyes, guaiazulenyl dyes, croconium dyes, polymethine indolium dyes, metal complex IR dyes, cyanine dyes, squarylium dyes, chalcogeno-pyryloarylidene dyes, indolizine dyes, pyrylium dyes, quinoid dyes, quinone dyes, azo dyes, and mixtures or derivatives thereof. Other suitable antennas can also be used in the present invention and are known to those skilled in the art and can be found in such references as *Infrared Absorbing Dyes*, Matsuoka, Masaru, ed., Plenum Press, New York, 1990 (ISBN 0-306-43478-4) and *Near-Infrared Dyes for High Technology Applications*, Daehne, Resch-Genger, Wolfbeis, Kluwer Academic Publishers (ISBN 0-7923-5101-0), both of which are incorporated herein by reference.

Consideration can also be given to choosing the radiation antenna such that any light absorbed in the visible range does not adversely affect the graphic display or appearance of the color forming composition either before or after development. For example, in order to achieve a visible contrast between developed areas and non-imaged or non-developed areas of the coating, the color former can be chosen to form a color that is different than that of the background. For example, color formers having a developed color such as black, blue, red, magenta, and the like can provide a good contrast to a more yellow background. Optionally, an additional non-color former colorant can be added to the color forming compositions of the present invention or the substrate on which the color forming composition is placed. Any known non-color former colorant can be used to achieve almost any desired background color for a given commercial product. Although the specific color formers and antennae discussed herein are typically separate compounds, such activity can also be provided by constituent groups of binders and/or color formers which are incorporated in the activation and/or radiation absorbing action of color former. These types of color former/radiation absorbers are also considered to be within the scope of the present invention.

Various radiation antennas can act as an antenna to absorb electromagnetic radiation of specific wavelengths and ranges. Generally, a radiation antenna which has a maximum light absorption at or in the vicinity of the desired development wavelength can be suitable for use in the present invention. For example, in one aspect of the present invention, the color forming composition can be optimized within a range for development using infrared radiation having a wavelength from about 720 nm to about 900 nm in one embodiment. Common CD-burning lasers have a wavelength of about 780 nm and can be adapted for forming images by selectively developing portions of the color forming composition. Radiation antennae which can be suitable for use in the infrared range can include, but are not limited to, polymethyl indoliums, metal complex IR dyes, indocyanine green, polymethine dyes such as pyrimidinetrione-cyclopentylidenes, guaiazulenyl dyes, croconium dyes, cyanine dyes, squarylium dyes, chalcogenopyryloarylidene dyes, metal thiolate complex dyes, bis(chalcogenopyrylo)polymethine dyes, oxyindolizine dyes, bis(aminoaryl)polymethine dyes, indolizine dyes, pyrylium dyes, quinoid dyes, quinone dyes, phthalocyanine dyes, naphthalocyanine dyes, azo dyes, hexafunctional polyester oligomers, heterocyclic compounds, and combinations thereof.

Several specific polymethyl indolium compounds which can be used are available from Aldrich Chemical Company, and include 2-[2-[2-chloro-3-[2-(1,3-dihydro-1,3,3-trimethyl-2H-indol-2-ylidene)-ethylidene]-1-cyclopenten-1-yl-ethenyl]-1,3,3-trimethyl-3H-indolium perchlorate; 2-[2-[2-Chloro-3-[2-(1,3-dihydro-1,3,3-trimethyl-2H-indol-2-ylidene)-ethylidene]-1-cyclopenten-1-yl-ethenyl]-1,3,3-trimethyl-3H-indolium chloride; 2-[2-[2-chloro-3-[(1,3-dihydro-3,3-dimethyl-1-propyl-2H-indol-2-ylidene)ethylidene]-1-cyclohexen-1-yl]ethenyl]-3,3-dimethyl-1-propylindolium iodide; 2-[2-[2-chloro-3-[(1,3-dihydro-1,3,3-trimethyl-2H-indol-2-ylidene)ethylidene]-1-cyclohexen-1-yl]ethenyl]-1,3,3-trimethylindolium iodide; 2-[2-[2-chloro-3-[(1,3-dihydro-1,3,3-trimethyl-2H-indol-2-ylidene)ethylidene]-1-cyclohexen-1-yl]ethenyl]-1,3,3-trimethylindolium perchlorate; 2-[2-[3-[(1,3-dihydro-3,3-dimethyl-1-propyl-2H-indol-2-ylidene)ethylidene]-2-(phenylthio)-1-cyclohexen-1-yl]ethenyl]-3,3-dimethyl-1-propylindolium perchlorate; and mixtures thereof. Alternatively, the radiation antenna can be an inorganic compound, e.g., ferric oxide, carbon black, selenium, or the like. Polymethine dyes or derivatives thereof such as a pyrimidinetrione-cyclopentylidene, squarylium dyes such as guaiazulenyl dyes, croconium dyes, or mixtures thereof can also be used in the present invention. Suitable pyrimidinetrione-cyclopentylidene infrared antennae include, for example, 2,4,6 (1H,3H,5H)-pyrimidinetrione 5-[2,5-bis[(1,3-dihydro-1,1,3-dimethyl-2H-indol-2-ylidene)ethylidene]cyclopentylidene]-1,3-dimethyl-(9Cl) (S0322 available from Few Chemicals, Germany).

In another aspect of the present invention, the radiation antenna can be selected for optimization of the color forming composition in a wavelength range from about 600 nm to about 720 nm, such as about 650 nm. Non-limiting examples of suitable radiation antennae for use in this range of wavelengths can include indocyanine dyes such as 3H-indolium, 2-[5-(1,3-dihydro-3,3-dimethyl-1-propyl-2H-indol-2-ylidene)-1,3-pentadienyl]-3,3-dimethyl-1-propyl-iodide) (Dye 724 λmax 642 nm), 3H-indolium,1-butyl-2-[5-(1-butyl-1,3-dihydro-3,3-dimethyl-2H-indol-2-ylidene)-1,3-pentadienyl]-3,3-dimethyl-,perchlorate (Dye 683 λmax 642 nm), and phenoxazine derivatives such as phenoxazin-5-ium,3,7-bis(diethylamino)-,perchlorate (oxazine 1 λmax=645 nm). Phthalocyanine dyes having a λmax of about the desired development wavelength can also be used such as silicon 2,3-napthalocyanine bis(trihexylsilyloxide) and matrix soluble derivatives of 2,3-napthalocyanine (both commercially available from Aldrich Chemical); matrix soluble derivatives of silicon phthalocyanine (as described in Rodgers, A. J. et al., 107 J. Phys. Chem. A 3503-3514, May 8, 2003), and matrix soluble derivatives of benzophthalocyanines (as described in Aoudia, Mohamed, 119 J. Am. Chem. Soc. 6029-6039, July 2, 1997); phthalocyanine compounds such as those described in U.S. Pat. Nos. 6,015,896 and 6,025,486, which are each incorporated herein by reference; and Cirrus 715 (a phthalocyanine dye available from Avecia, Manchester, England having a λmax=806 nm).

In yet another aspect of the present invention, laser light having blue and indigo wavelengths from about 300 nm to about 600 nm can be used to develop the color forming compositions. Therefore, the present invention can provide color forming compositions optimized within a range for use in devices that emit wavelengths within this range. Recently developed commercial lasers found in certain DVD and laser disk recording equipment provide for energy at a wavelength of about 405 nm. Thus, the compositions of the present invention using appropriate radiation antennae can be suited for use with components that are already available on the market or are readily modified to accomplish imaging. Radiation antennae which can be useful for optimization in the blue (~405nm) and indigo wavelengths can include, but are not limited to, aluminum quinoline complexes, porphyrins, porphins, and mixtures or derivatives thereof. Non-limiting specific examples of suitable radiation antenna can include 1-(2-chloro-5-sulfophenyl)-3-methyl-4-(4-sulfophenyl)azo-2-pyrazolin-5-one disodium salt (λmax=400 nm); ethyl 7-diethylaminocoumarin-3-carboxylate (λmax=418 nm); 3,3'-diethylthiacyanine ethylsulfate (λmax=424 nm); 3-allyl-5-(3-ethyl-4-methyl-2-thiazolinylidene)rhodanine (λmax=430 nm) (each available from Organica Feinchemie GmbH Wolfen), and mixtures thereof. Non-limiting specific examples of suitable aluminum quinoline complexes can include tris(8-hydroxyquinolinato)aluminum (CAS 2085-33-8) and derivatives such as tris(5-cholor-8-hydroxyquinolinato)aluminum (CAS 4154-66-1), 2-(4-(1-methyl-ethyl)-phenyl)-6-phenyl-4H-thiopyran-4-ylidene)-propanedinitril-1,1-dioxide (CAS 174493-15-3), 4,4'-[1,4-phenylenebis(1,3,4-oxadiazole-5,2-diyl)]bis N,N-diphenyl benzeneamine (CAS 184101-38-0), bis-tetraethylammonium-bis(1,2-dicyano-dithiolto)-zinc(II) (CAS 21312-70-9), 2-(4,5-dihydronaphtho[1,2-d]-1,3-dithiol-2-ylidene)-4,5-dihydro-naphtho[1,2-d]1,3-dithiole, all available from Syntec GmbH. Non-limiting examples of specific porphyrin and porphyrin derivatives can include etioporphyrin 1 (CAS 448-71-5), deuteroporphyrin IX 2,4 bis ethylene glycol (D630-9) available from Frontier Scientific, and octaethyl porphyrin (CAS 2683-82-1), azo dyes such as Mordant Orange (CAS 2243-76-7), Methyl Yellow (CAS 60-11-7), 4-phenylazoaniline (CAS 60-09-3), Alcian Yellow (CAS 61968-76-1), available from Aldrich chemical company, and mixtures thereof.

In each of these embodiments, generally, the radiation absorber can be present in the color forming composition as a whole at from about 0.001 wt % to about 10 wt %, and typically, from about 0.5 wt % to about 1 wt %, although other weight ranges may be desirable depending on the molar absorbtivity of the particular radiation absorber.

Other Optional Ingredients

The color forming compositions of the present invention can also include various additional components such as colorants, liquid vehicles, stabilizers, anti-fade agents, plasticizers, and other additives known to those skilled in the art.

For example, in one embodiment, it may be desirable to include a reducing agent. Specific reducing agent activators than can be used include 1-phenyl-3-pyrozolidone(phenidone), hydrazine, formamide, formic acid, hexaarylbiimidazoles (HABI), ascorbic acid, phenols and substituted phenols, e.g., hydroquinone, and mixtures thereof.

In certain embodiments of the present invention, it is sometimes desirable to add a plasticizer to improve coating flexibility, durability, and coating performance. Plasticizers can be either solid or liquid plasticizers. Such suitable plasticizers are well known to those skilled in the art, as exemplified in U.S. Pat. No. 3,658,543, which is incorporated herein by reference in its entirety. Specific examples of plasticizers include, but are not limited to, cellulose esters such as an o-phenyl phenol ethylene oxide adduct (commercially available as MERPOL 2660 from E. I. Du Pont de Nemours & Co., Wilmington, Del.), polyethylene glycols and substituted phenolethylene oxide adducts such as nonylphenoxypoly(ethyleneoxy)-ethanol (commercially available as IGEPAL CO 210 from Aldrich Chemical Co.), acetates, butyrates, cellulose acetate butyrates, and mixtures thereof. The plasticizer can be included in either or both of the polymer matrix and the color former phase.

Other additives can also be utilized for producing particular commercial products such as including a colorant to impart additional desired color to the image. In one embodiment, these colorants can be non-color formers which can provide a background color. In one embodiment, optional colorants can be standard pigments and/or dyes. For example, the use of an opacifier pigment or other colorant can provide background color to the substrate. The optional colorants can be added to the color forming composition, underprinted, or overprinted, as long as the development of the color former is not prevented from at least some development due to the presence of the optional colorant.

In another embodiment, the color forming composition can be prepared in a solution which is substantially transparent or translucent. Any suitable liquid carrier, e.g., an alcohol with a surfactant, can be used which is compatible with a particular color former, polymer matrix, and/or other components chosen for use. The liquid carrier can include, but is not limited to, solvents such as methylethyl ketone, isopropyl alcohol or other alcohols and diols, water, surfactants, and mixtures thereof. When the color forming composition is prepared in a solution form, it may be desirable to underprint a colored coating over at least a portion of the substrate beneath the color forming composition. The optional colored coating produces a background color that can be visible underneath the solution layer. This colored coating can contain various colorants such as other pigments and/or dyes.

In one embodiment of the present invention, the color forming composition can be applied to a substrate. The composition can be applied to the substrate using any known technique such as spin-coating, screen printing, sputtering, spray coating, ink-jetting, or the like. A variety of substrates can be used such as polymer, paper, metal, glass, ceramic, and combinations or composites thereof. In one embodiment, the color forming composition can be applied to an optical disk, and thus, select portions thereof can be subsequently developed using a laser or other radiation source. Suitable coating thicknesses can be from about 1 µm to about 15 µm.

The color forming composition can be prepared in a number of ways for application to a substrate. Often, the liquid carrier can be used which can be at least partially removed through known solvent removal processes. Typically, at least a portion of the liquid carrier can be driven off or allowed to evaporate after the coating process is complete. Alternatively, in some embodiments, it may not be necessary to use a liquid carrier, as the polymer matrix can be used as a carrier. Further, various additional components, such as lubricants, surfactants, and materials imparting moisture resistance, can also be added to provide mechanical protection to the color forming composition. Other overcoat compositions can also be used and are well known to those skilled in the art.

In one aspect of the present invention, the color forming composition can be spin-coatable or screen-printable. In order to provide desirable color forming properties and spin-coatability, various factors such as viscosity and solids content can also be considered. The color forming compositions of the present invention can have less than about 10 wt % solids, which typically provides good coating properties. For example, in one aspect, the solids content of a spin-coatable color forming composition can be from about 5 wt % to about 9 wt %.

Radiation Application for Development

Once the color forming composition is applied to the substrate, the conditions under which the color forming compositions of the present invention are developed can be varied. For example, one can vary the electromagnetic radiation wavelength, heat flux, and exposure time. The amount of energy which is to be applied depends partially on the activation energy of the development reaction of the color former and the specific radiation absorber chosen. However, the energy applied is typically sufficient to develop the color former without also chemically decomposing the color forming composition or damaging the substrate. Such an energy level is typically well below the energy required for decomposition of the color forming composition. Variables such as spot size, focus, and laser power will also affect any particular system design and can be chosen based on the desired results. With these variables fixed at predetermined values, the radiation source can then direct electromagnetic radiation to the color forming composition in accordance with data received from a signal processor. Further, color former and/or radiation absorber concentration and proximity to one another can also be varied to affect the development times and the optical density of the developed image.

Typically, an image to be formed on the surface can be digitally stored and then rasterized or spiralized. The resulting data can be delivered to a radiation source which exposes portions of the color forming composition to radiation while the optical disk is spinning. As previously discussed, any number of electromagnetic radiation sources can be used.

The color forming compositions of the present invention can be developed using lasers having from about 15 mW to about 100 mW power usage, although lasers having a power outside this range can also be used. Typically, lasers having from about 30 mW to about 50 mW are readily commercially available and work well using the color forming composition described herein. The spot size generated by the laser can be determined by radiation that contacts the substrate at a single point in time. The spot size can be circular, oblong, or other geometric shape, and can range from about 1 µm to about 200 µm along a largest dimension and often from about 5 µm to about 60 µm, though smaller or larger sizes can also be used. In a further aspect, spot sizes of 5 to 25 µm by 50 µm, as measured across perpendicular major and minor axes, can provide a good balance between resolution and developing speed.

Heat flux is a variable that can be altered as well, and can be from about 0.05 J/cm² to about 5.0 J/cm² in one embodiment, and from about 0.3 J/cm² to about 0.5 J/cm² in a second embodiment. In general, a heat flux of less than about 0.5 J/cm² can also be used. The color forming compositions of the present invention can be optimized by adjusting the concentrations and type of radiation absorber, color former, and polymer matrix. Heat flux in these ranges allow for development of color formers in optimized compositions in from about 15 μsec to about 1 millisecond per dot in some embodiments. As previously discussed, in part because of the small particle size of the color former phase, improved sensitivity of the composition can promote faster image writing. Thus, in one embodiment, the color forming compositions of the present invention can be optimized for development in less than about 200 μsec, and in some embodiments less than about 50 μsec. An exemplary range of development time that is practical in accordance with embodiments of the present invention is from about 15 μsec to about 200 μsec. Those skilled in the art can adjust these and other variables to achieve a variety of resolutions and developing times.

In embodiments where the substrate is an optical disk or other moving substrate, the exposure time will depend on the rate of motion of the substrate. More specifically, in such embodiments, the exposure times above refer to the time during which a point on the substrate is exposed to the radiation. For example, a spot size of 50 μm along the direction of rotation will result in a single point on the substrate traveling through the spot starting at one edge and traveling to the opposite edge. The total exposure time is therefore the average time that radiation contacts a particular point on the substrate or color forming composition.

Though any laser can be used to provide energy to the color forming compositions, currently there are many known laser types. Those of particular interest include those commercially available which can be incorporated into an optical disk reading and/or writing device, particularly those in the 200 nm to 1200 nm wavelength range. However, wavelengths outside of this range are also included in accordance with embodiments of the present invention. Exemplary laser types that can be used include krypton-fluoride excimer (249 nm), xenon-chloride eximer (308 nm), nitrogen gas (337 nm), organic dye in solution (300 nm to 1000 nm—tunable), krypton ion (335 nm to 800 nm), argon ion (450 nm to 530 nm), helium neon (543 nm, 632.8 nm, and 1150 nm), semiconductor GaInP family (670 nm to 680 nm), ruby (694 nm), semiconductor GaAlAs family (750 nm to 900 nm), neodymium YAG (1064 nm), semiconductor InGaAsP family (1300 nm to 1600 nm), hydrogen-fluoride chemical (2600 nm to 3000 nm), etc. In addition to the above, these and other commercially available lasers are available having wavelengths of: 375 nm, 405 nm, 408 nm, 440 nm, 635 nm, 638 nm, 650 nm, 660 nm, 670 nm, 685 nm, 780 nm, 785 nm, 810 nm, 830 nm, 850 nm, 980 nm, 1084 nm, 1310 nm, and 1550 nm, for example. These laser-types or others are useable in accordance with embodiments of the present invention, provided the laser energy is functional with the color forming compositions in accordance with embodiments of the present invention.

EXAMPLES

The following examples illustrate exemplary embodiments of the invention. However, it is to be understood that the following are only exemplary or illustrative of the application of the principles of the present invention. Numerous modifications and alternative compositions, methods, and systems may be devised by those skilled in the art without departing from the spirit and scope of the present invention. The appended claims are intended to cover such modifications and arrangements. Thus, while the present invention has been described above with particularity, the following examples provide further detail in connection with what is presently deemed to be practical embodiments of the invention.

Example 1 a) Preparation of Color Former Particles for Color Former Phase (Discontinuous Phase)

About 10 g of m-terphenyl (accelerator) was melted in a beaker, and the melt was heated to about 110° C. About 100 g of BK400 was added in small increments to the melt upon constant stirring. The added BK400 is a leuco-dye (2'-anilino-3'-methyl-6'-(dibutylamino)fluoran) available from Nagase Corporation, the structure of which is set forth below as Formula 1:

Formula 1

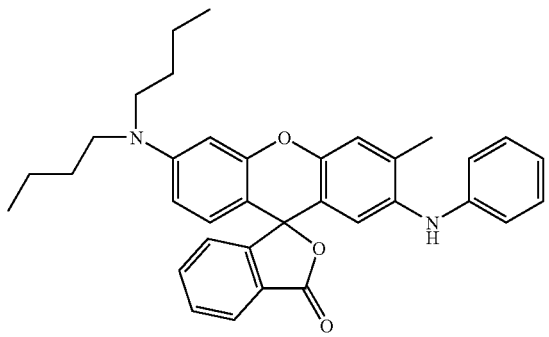

The temperature of the mixture was increased up to about 170° C. to 180° C. Stirring was continued until complete dissolution of BK400 in the melt (usually takes about 10 to 15 min) was obtained to form an accelerator/leuco dye solution. Next, about 1.8 g of Cirrus-715 (radiation absorber IR dye) was added to the melt upon constant stirring. Heating and stirring was continued for about two to three additional minutes until the Cirrus-715 was completely dissolved in the melt to form a leuco dye/antenna/accelerator alloy (eutectic). The temperature of the leuco-dye/antenna/accelerator alloy was kept to below about 190° C., and was then poured into a pre-cooled freezer tray lined with aluminum foil. The solidified melt was milled into a coarse powder and then jet-milled until the average volume-weighted particle size of the ground alloy was less than about 1.5 μm, resulting in color former particles that will become the color former phase.

b) Preparation of Polymeric Activator Phase (Continuous Phase)

About 50 g of m-terphenyl was melted in a beaker. About 50 g of Cirrus-715 (radiation absorber IR dye) was then dissolved in the melted m-terphenyl while the temperature of the melt was raised to about 150° C. to 160° C. The resulting m-terphenyl/Cirrus-715 alloy was cooled and ground into a coarse powder. Next, about 8 g of 4-hydroxyphenyl-4'-isopropoxyphenyl sulfone (activator), 1.7 g of the m-terphenyl/Cirrus-715 alloy, and about 3.7 g of 4,4-dihydroxydiphenyl sulfone (primary activator) were dissolved in 49 g Nor-Cote CDG000 UV-lacquer (mixture or packet of UV-curable acrylate monomers and oligomers) to form a lacquer/antenna/activator solution or polymeric activator phase.

c) Preparation of Color Forming Composition (Fine Dispersion)

A UV-curable paste was prepared by mixing (a) about 31 of the finely milled color former particles with (b) about 60 g of the polymeric accelerator phase. The paste was screen printed onto a substrate at a thickness of approximately about 6 μm to about 8 μm to form an imaging medium including an imaging coating. The imaging coating was UV cured by mercury lamp. Direct marking on the UV cured imaging coating was carried out using a 45 mW laser having a wavelength of about 780 nm. A mark of approximately 20 μm by 45 μm was produced using various durations of energy application from about 30 μsec to about 150 μsec. Upon application of appropriate energy, the color forming composition of the imaging coating changed in color from a greenish transparent appearance to a black color.

Example 2 a) Preparation of Color Former Particles for Color Former Phase (Discontinuous Phase)

About 10 g of m-terphenyl (accelerator) was melted in a beaker, and the melt was heated to about 110° C. About 100 g of BK400 was added in small increments to the melt upon constant stirring. The added BK400 is a leuco-dye (2'-anilino-3'-methyl-6'-(dibutylamino)fluoran) available from Nagase Corporation, the structure of which is set forth in Formula 1 above. The temperature of the mixture was then increased up to about 170° C. to 180° C. Stirring was continued until complete dissolution of BK400 in the melt (usually takes about 10 to 15 min) was obtained to form an accelerator/leuco dye solution melt. About 1.2 g of IR780-iodide (radiation absorber IR dye) was then added to the melt upon constant stirring. IR780-iodide is also known as 3H-Indolinium, 2-[2-chloro-3-[91,3-dihydro3,3-dimethyl-1-propyl-2H-indol-2-ylidene)ethylidene]-1-cyclohexen-1yl]ethenenyl]-3,3-dimethyl-1-propyl-, iodide(9Cl), as shown in Formula 2 as follows:

Formula 2

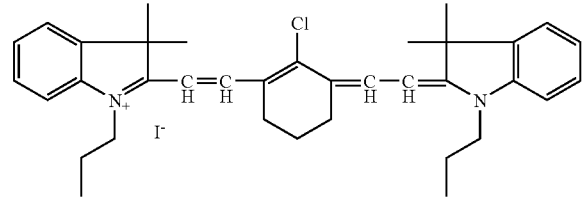

Heating and stirring was continued for about two to three additional minutes until the IR dye was completely dissolved in the melt to form a leuco dye/antenna/accelerator alloy (eutectic). The temperature of the leuco dye/antenna/accelerator alloy was kept to below about 190° C. The leuco-dye/antenna/accelerator alloy was then poured into a pre-cooled freezer tray lined with aluminum foil. The solidified melt was milled into a coarse powder, and then the pre-milled powder was milled in aqueous dispersion (~15% solids) using Netzsch Mini-Zeta Bead mill with 1 mm zirconia beads. The milling was stopped when average particle diameter was reduced to a value of about 0.9 μm to about 1.0 μm. The particles in the slurry were collected and freeze-dried, resulting in color former particles that will become the color former phase.

b) Preparation of Polymeric Activator Phase (Continuous Phase)

About 50 g of m-terphenyl was melted in a beaker. About 50 g of Cirrus-715 (radiation absorber IR dye) was then dissolved in the melted m-terphenyl while the temperature of the melt was raised to about 150° C. to 160° C. The resulting m-terphenyl/Cirrus-715 alloy was cooled and ground into a coarse powder. Next, about 8 g of 4-hydroxyphenyl-4'-isopropoxyphenyl sulfone (activator), 1.7 g of the m-terphenyl/Cirrus-715 alloy, and about 3.7 g of 4,4-dihydroxydiphenyl sulfone (primary activator) were dissolved in 49 g Nor-Cote CDG000 UV-lacquer (mixture or packet of UV-curable acrylate monomers and oligomers) to form a lacquer/antenna/activator solution or polymeric activator phase.

c) Preparation of Color Forming Composition (Fine Dispersion)

A UV-curable paste was prepared by mixing (a) about 31 of the finely milled the color former particles with (b) about 60 g of the polymeric accelerator phase. The paste was screen printed onto a substrate at a thickness of approximately about 6 μm to about 8 μm to form an imaging medium including an imaging coating. The coating on the medium was then UV cured by mercury lamp. The resulting coating had an opalescent semi-transparent look. Direct marking on the UV cured imaging coating was carried out using a 45 mW laser having a wavelength of about 780 nm. A mark of approximately 20 μm by 45 μm was produced using various durations of energy application from about 25 μsec to about 130 μsec. Upon application of appropriate energy, the color forming composition of the imaging coating changed in color from a greenish transparent appearance to a black color.

Example 3 a) Preparation of Color Former Particles for Color Former Phase (Discontinuous Phase)

About 10 g of m-terphenyl (accelerator) was melted in a beaker, and the melt was heated to about 110° C. About 100 g of BK400 was added in small increments to the melt upon constant stirring. The added BK400 is a leuco-dye (2'-anilino-3'-methyl-6'-(dibutylamino)fluoran) available from Nagase Corporation, the structure of which is set forth in Formula 1 above. The temperature of the mixture was increased up to about 170° C. to 180° C. Stirring was continued until complete dissolution of BK400 in the melt (usually takes about 10 to 15 min) was obtained to form an accelerator/leuco dye solution. Next, about 1.8 g of Cirrus-715 (radiation absorber IR dye) was added to the melt upon constant stirring. Heating and stirring was continued for about two to three additional minutes until the Cirrus-715 was completely dissolved in the melt to form a leuco dye/antenna/accelerator alloy (eutectic). The temperature of the leuco-dye/antenna/accelerator alloy was kept to below about 190° C., and was then poured into a pre-cooled freezer tray lined with aluminum foil. The solidified melt was milled into a coarse powder and then jet-milled until the average volume-weighted particle size of the ground alloy was less than about 1.5 μm. Next, this pre-milled powder was further milled in an aqueous dispersion (~15% solids) using Netzsch Mini-Zeta Bead mill with 1 mm zirconia beads. The milling was stopped when average particle diameter was reduced to a value of about 0.9 μm to about 1.0 μm. The resulting slurry was then further milled in the Netzsch Mini-Zeta Bead mill using tungsten carbide 0.1 mm beads until the average particle size was reduced to about 0.2 μm to about 0.3 µm. The resulting slurry containing the color former particles which will ultimately become the color former phase was collected and freeze-dried.

b) Preparation of Polymeric Activator Phase (Continuous Phase)

About 87 g of 4-hydroxyphenyl-4'-isopropoxyphenyl sulfone activator was melted in a beaker. About 13 g of IR780-iodide (radiation absorber IR dye shown in Formula 2) was then dissolved in the melted activator while the temperature of the melt was raised to about 150° C. to 160° C. The resulting activator/radiation absorber alloy was cooled and ground into a coarse powder. Next, about 7 g of the activator/radiation absorber alloy powder and about 3.7 g of 4,4-dihydroxydiphenyl sulfone (primary activator) were dissolved in 49 g Nor-Cote CDG000 UV-lacquer (mixture or packet of UV-curable acrylate monomers and oligomers) to form the lacquer/antenna/activator solution or polymeric activator phase.

c) Preparation of Color Forming Composition (Fine Dispersion)

A UV-curable paste was prepared by mixing (a) about 31 of the finely milled the color former particles with (b) about 60 g of the polymeric accelerator phase. The paste was screen printed onto a substrate at a thickness of approximately about 6 µm to about 8 µm to form an imaging medium including an imaging coating. The coating on the medium was then UV cured by mercury lamp. The resulting coating was transparent with noticeable greenish hue. Direct marking on the UV cured imaging coating was carried out using a 45 mW laser having a wavelength of about 780 nm. A mark of approximately 20 µm by 45 µm was produced using various durations of energy application from about 15-20 µsec to about 100 µsec. Upon application of appropriate energy, the color forming composition of the imaging coating changed in color from the greenish transparent appearance to a black color.

Example 4

The above color forming compositions of eutectics (Examples 1 to 3) with average particle sizes of 2 µm or less has shown significantly higher contrast and sensitivity than the materials with larger average particle sizes, e.g., 5 µm, when developed at similar. To illustrate this, various comparative materials were prepared in accordance with Example 1, except that each material utilized a different particle size resulting from different levels of milling. Particularly, the particle sizes prepared were 2 µm and 5 µm, as shown in Table 1, and 3.7 µm, 2.3 µm, 1.5 µm, and 0.25 µm as shown in Tables 2 and 3.

In Table 1 below, legible marks ($\Delta L^*$ of >10), at much higher speeds (lower energy input) were obtained using the composition having a smaller particle size.

TABLE 1

| Particle size, µm | 2 | 5 |
|---|---|---|
| Speed for Mark ($\Delta L^*$ of 10), m/sec | 0.75 | 0.25 |
| Contrast of mark at 0.25 m/Sec, $\Delta L^*$ | 32 | 12 |

In Tables 2 and 3 below, particle size was also shown to impact write speed and contrast performance. Specifically, in Table 2 below, the following test conditions for write speed were established: maximum 780 nm laser spot linear velocity necessary to mark with contrast $\Delta L^* \geq 20$ (Laser Power=38 mW/marking density=1040 tracks per inch). The results of this analysis are shown, as follows:

TABLE 2

| Particle size, µm | Linear velocity, m/sec |
|---|---|
| 3.7 | 0.32 |
| 2.3 | 0.4 |
| 1.5 | 0.52 |
| 0.25 | 0.67 |

In Table 3, contrast was determined marking with 780 nm laser (Power=38 mW; marking density=1040 tracks per inch) at laser spot Linear Velocity=0.6 m/sec, the results being shown as follows:

TABLE 3

| Particle size, µm | Contrast, $\Delta L^*$ |
|---|---|
| 3.7 | 9.38 |
| 2.3 | 12.67 |
| 1.5 | 16.23 |
| 0.25 | 21.29 |

It is to be understood that the above-referenced arrangements are illustrative of the application for the principles of the present invention. Numerous modifications and alternative arrangements can be devised without departing from the spirit and scope of the present invention while the present invention has been described above in connection with the exemplary embodiments(s) of the invention. It will be apparent to those of ordinary skill in the art that numerous modifications can be made without departing from the principles and concepts of the invention as set forth in the claims.

What is claimed is:

1. A method of forming an image, comprising applying electromagnetic radiation to a color forming composition sufficient to develop the color forming composition from a pre-development state to a post-development state that is visually different than the pre-development state, said color forming composition, comprising:

a) a polymeric activator phase including a polymer matrix and an activator dissolved therein;

b) a color former phase including a color former and a second activator, said color former phase being finely dispersed within the polymeric activator phase at an average particle size of less than 2 µm; and c) a radiation absorber in thermal contact with the color former phase;

wherein the color forming composition is configured for development in less than about 200 µs.

2. A method as in claim 1, wherein the electromagnetic radiation is applied for a duration and at an energy level such that the color forming composition does not decompose.

3. The method of claim 1, wherein the electromagnetic radiation is laser energy.

4. The method of claim 1, wherein the electromagnetic radiation is applied at from about 0.05 J/cm$^2$ to about 5 J/cm$^2$.

5. The method of claim 1, wherein the electromagnetic radiation is applied for about 15 µsec to about 200 µsec.

6. The method of claim 1, wherein the electromagnetic radiation is applied at a spot size from about 10 µm to about 60 µm.

7. The method of claim 1, wherein the electromagnetic radiation is applied at a power level from about 15 mW and about 100 mW.

8. The method of claim 1, wherein the electromagnetic radiation has a wavelength from about 200 nm to about 1200 nm.

9. The method of claim 1, further comprising the preliminary step of applying the color forming composition to a substrate.

10. The method of claim 9, wherein the color forming composition is applied to the substrate at a thickness from about 1 μm to about 15 μm.

11. The method of claim 9, wherein the substrate is selected from the group consisting of polymer, paper, metal, glass, ceramic, and combinations or composites thereof.

12. The method of claim 9, wherein the substrate is an optical disk.

13. The method of claim 1, wherein the polymer matrix includes a radiation curable polymer.

14. The method of claim 1, wherein the polymeric activator phase further comprises an aromatic stabilizer configured to stabilize the color former in the post-development state.

15. The method of claim 1, wherein the average particle size of the color former phase is less than about 1.5 μm.

16. The method of claim 1, wherein the average particle size of the color former phase is from about 0.2 μm to about 1.5 μm.

17. The method of claim 1, wherein the average particle size of the color former phase is from about 0.05 μm to about 1 μm.

18. The method of claim 1, wherein the average particle size of the color former phase is from about 0.05 μm to about 0.7 μm.

19. The method of claim 1, wherein the color former phase is distinct and substantially insoluble in the polymeric activator phase at room temperature, and wherein upon application of heat at from about 90° C. to about 350° C., the polymeric activator phase becomes at least partially molten or undergoes phase transition, and the color former phase at least partially melts or undergoes phase transition therein.

20. The method of claim 1, wherein the color former phase further comprises a melting aid having a melting temperature from about 50° C. to about 150° C.

21. The method of claim 1, wherein the color former is a leuco dye.

22. The method of claim 1, wherein the leuco dye is a fluoran.

23. The method of claim 1, wherein the radiation absorber is dispersed or dissolved within the polymeric activator phase.

24. The method of claim 1, wherein the radiation absorber is dispersed or dissolved within the color former phase.

25. The method of claim 1, wherein a first portion of the radiation absorber is dispersed or dissolved within the polymeric activator phase, and wherein a second portion of the radiation absorber is dispersed or dissolved within the color former phase.

26. The method of claim 1, wherein the electromagnetic radiation is laser energy, and wherein the laser energy wavelength is greater than or equal to the particle size of the color former phase prior to application of the laser energy.

27. The method of claim 1, wherein the electromagnetic radiation is laser energy, and wherein the particle size of the color former phase prior to application of the laser energy is no more than two times larger than the wavelength of the laser energy.

28. A color forming composition, comprising:
a) a polymeric activator phase including a polymer matrix and an activator dissolved therein;
b) a color former phase including color former particles, said color former particles comprising:
  i) a color former,
  ii) a second activator, and
  iii) a radiation absorber,
said color forming particles being finely dispersed within the polymeric activator phase at an average particle size of less than 2 μm.

29. The composition of claim 28, wherein the polymer activator phase further comprises a second radiation absorber.

30. The composition of claim 29, wherein the radiation absorber and the second radiation absorber are different.

31. The composition of claim 28, wherein the polymer matrix includes a radiation curable polymer.

32. The composition of claim 31, wherein the radiation curable polymer is curable at a curing wavelength that is different than a developing wavelength which would cause the color forming composition to change or develop color.

33. The composition of claim 32, wherein the curing wavelength is in the ultraviolet range.

34. The composition of claim 32, wherein the developing wavelength is in the infrared range.

35. The composition of claim 32, wherein the developing wavelength is from about 200 nm to about 1200 nm.

36. The composition of claim 28, wherein the polymeric activator phase further comprises an aromatic stabilizer.

37. The composition of claim 36, wherein the aromatic stabilizer is configured to stabilize the color former in the post-development state.

38. The composition of claim 28, wherein the average particle size of the color former particles is less than about 1.5 μm.

39. The composition of claim 28, wherein the average particle size of the color former particles is from about 0.2 μm to about 1.5 μm.

40. The composition of claim 28, wherein the average particle size of the color former phase is from about 0.05 μm to about 1 μm.

41. The composition of claim 28, wherein the average particle size of the color former phase is from about 0.05 μm to about 0.7 μm.

42. The composition of claim 28, wherein the color former is a leuco dye.

43. The composition of claim 42, wherein the leuco dye is a fluoran.

44. The composition of claim 28, wherein the color forming composition is configured for development in less than about 200 μs.

45. The composition of claim 28, wherein the color forming composition has a pre-development state and a post-development state, the pre-development state having an appearance that is visually different than the post-development state.

46. The composition of claim 28, wherein the color forming composition is either colorless or has a first color when in the pre-development state, and is a second color after development in the post-development state.

47. The composition of claim 28, wherein the color former phase comprises from about 1 wt % to about 40 wt % of the color forming composition.

48. The composition of claim 28, wherein the color former phase is distinct and substantially insoluble in the polymeric activator phase at room temperature, and wherein upon application of heat or light energy to cause a temperature from about 90° C. to about 350° C., the polymeric activator phase becomes at least partially molten or undergoes phase transition, and the color former phase at least partially melts or undergoes phase transition therein.

49. The composition of claim 28, wherein the color former phase further comprises a melting aid having a melting temperature from about 50° C. to about 150° C.

50. The composition of claim 28, wherein the radiation absorber is dispersed or dissolved within the polymeric activator phase.

51. The composition of claim 28, wherein the radiation absorber is dispersed or dissolved within the color former phase.

52. The composition of claim 28, wherein a first portion of the radiation absorber is dispersed or dissolved within the polymeric activator phase, and wherein a second portion of the radiation absorber is dispersed or dissolved within the color former phase.

53. The composition of claim 28 applied to a substrate.

54. The composition of claim 53, wherein the substrate is selected from the group consisting of polymer, paper, metal, glass, ceramic, and combinations or composites thereof.

* * * * *